US007550513B2

(12) United States Patent
Hirakoso et al.

(10) Patent No.: US 7,550,513 B2
(45) Date of Patent: Jun. 23, 2009

(54) FINE METAL HYDRIDE PARTICLES, THEIR PRODUCTION PROCESS, DISPERSION CONTAINING FINE METAL HYDRIDE PARTICLES AND METALLIC MATERIAL

(75) Inventors: Hideyuki Hirakoso, Yokohama (JP); Keisuke Abe, Yokohama (JP); Yasuhiro Sanada, Yokohama (JP); Kentarou Tsunozaki, Yokohama (JP)

(73) Assignee: Asahi Glass Company, Limted, Tokyo (JP)

( * ) Notice: Subject to any disclaimer, the term of this patent is extended or adjusted under 35 U.S.C. 154(b) by 0 days.

(21) Appl. No.: 11/296,321

(22) Filed: Dec. 8, 2005

(65) Prior Publication Data

US 2006/0070493 A1 Apr. 6, 2006

Related U.S. Application Data

(63) Continuation of application No. PCT/JP2004/008370, filed on Jun. 9, 2004.

(30) Foreign Application Priority Data

Jun. 10, 2003 (JP) ............................. 2003-164666

(51) Int. Cl.
*C08J 3/02* (2006.01)

(52) U.S. Cl. .................... 516/100; 423/645; 75/255; 977/773

(58) Field of Classification Search ................ 423/644, 423/645; 516/100; 75/255, 331; 977/773, 977/810, 932, 940, 952, 956

See application file for complete search history.

(56) References Cited

U.S. PATENT DOCUMENTS

| 3,844,854 | A | * | 10/1974 | Self et al. ................ 149/6 |
| 3,963,831 | A | * | 6/1976 | Lenz et al. .............. 423/646 |
| 4,666,735 | A | | 5/1987 | Hoover et al. |
| 6,528,441 | B1 | * | 3/2003 | Heung et al. ............. 501/12 |
| 6,589,312 | B1 | * | 7/2003 | Snow et al. ............... 75/255 |
| 6,953,600 | B2 | * | 10/2005 | Yokoyama et al. ........ 427/123 |
| 2003/0170314 | A1 | * | 9/2003 | Burrell et al. ............. 424/618 |
| 2006/0070493 | A1 | | 4/2006 | Hirakoso et al. |

FOREIGN PATENT DOCUMENTS

| JP | 46-2162 | 1/1971 |
| JP | 60-160192 | 8/1985 |
| JP | 2-294417 | 12/1990 |
| JP | 2002-126869 | 5/2002 |
| JP | 2002-324966 | * 8/2002 |
| JP | 2002-324966 | 11/2002 |
| JP | 2002-334618 | 11/2002 |

OTHER PUBLICATIONS

Abe et al, Journal of Sol-Gel Science and Technology, (2001), vol. 22, pp. 151-166.
Hanneken et al, Journal of Alloys and Compounds, (2002), vol. 330-332, pp. 714-717.
Sibirtsev et al, Solid State Communications, (1998), vol. 108, No. 8, pp. 583-586.
Fitzsimons et al, J. Chem. Soc. Faraday Trans. 1995, vol. 91, No. 4, pp. 713-718.
U.S. Appl. No. 11/501,801, filed Aug. 10, 2006, Hirakoso, et al.
Myung W. Lee, et al., "Atomistic calculations of hydrogen loading in palladium", Journal of Alloys and Compounds 231 (1995) pp. 343-346.
E.M. Salomons, et al., "Pressure-Composition Isotherms of Thin $PdH_c$ Films", Journal of the Less-Common Metals, 130 (1987), pp. 415-420.
H.S. Lim, et al., "Effects of nickel- and copper-coating of hydride alloys on the electrode reactions of metal-hydride electrodes", Journal of Power Sources 66 (1997), pp. 97-100.
Jacek Przepiórski, et al., "Method for Preparation of Copper-Coated Carbon Material", Chem. Mater. 2003, 15, pp. 862-865.
Holleman-Wiberg, Inorganic Chemistry, "Copper [2]; Elemental Copper", Academic Press, 2001, ISBN 0123526515, pp. 1249-1290.

* cited by examiner

*Primary Examiner*—Steven Bos
*Assistant Examiner*—Paul Wartalowicz
(74) *Attorney, Agent, or Firm*—Oblon, Spivak, McClelland, Maier & Neustadt, P.C.

(57) ABSTRACT

It is to provide fine particles of copper, nickel or palladium hydride having an average particle diameter of at most 50 nm, which are hardly oxidized in the atmosphere and are excellent in storage stability and are thereby very suitable for formation of metallic materials, and their production process. Further, it is to provide a dispersion containing fine particles of copper, nickel or palladium hydride, which is excellent in storage stability, and a metallic material obtained by applying the dispersion, followed by baking. The fine particles of copper, nickel or palladium hydride and the dispersion thereof, to be obtained by the present invention, are applicable to various applications, and they can be used for e.g. formation and repair of printed wiring, etc. employing a dispersion, interlayer wiring in semiconductor packages, and joining of printed wiring boards and electronic components.

10 Claims, No Drawings

FINE METAL HYDRIDE PARTICLES, THEIR PRODUCTION PROCESS, DISPERSION CONTAINING FINE METAL HYDRIDE PARTICLES AND METALLIC MATERIAL

TECHNICAL FIELD

The present invention relates to fine particles of copper, nickel or palladium hydride which are hardly oxidized in the atmosphere and are excellent in storage stability, and are thereby very suitable for formation of metallic materials, and their production process. Further, it relates to a dispersion containing fine particles of copper, nickel or palladium hydride, which is excellent in storage stability, and a metallic material to be obtained by applying the dispersion, followed by baking.

BACKGROUND ART

In recent years, various methods have been studied to form an electric conductor by forming a pattern employing an ink comprising a dispersion having fine particles of a metal such as copper dispersed in a liquid, followed by a heat treatment so that the metal fine particles are mutually sintered. Such methods may, for example, be a method of carrying out formation, repair or the like of a circuit pattern such as printed wiring by means of an ink jet printing method as disclosed in JP-A-2002-324966, a method of joining metals which replaces conventional soldering, as disclosed in JP-2002-126869, and a method of forming an electrically conductive metal film capable of replacing a plated film in the field of electronic materials, as disclosed in JP-A-2002-334618.

The above-described methods employ known nature called surface melting of metal particles ("J. Sol-Gel Science and Technology" the Netherlands, Kluwer Academic Publishers, 2001, vol. 22, pages 151 to 166). It is generally known that the surface melting of metal particles takes place due to abnormal lattice vibration of atoms at the surface of the particles, and that the smaller the particle diameter and the higher the proportion of surface atoms, the more the surface melting temperature decreases. For example, in a case of copper, it is known that bulk copper has a melting point of 1,083° C., whereas fine particles having diameters of about 10 nm undergo the surface melting at a temperature of about 150° C. Since the surface melting depends on the particle diameter of the metal particles, it takes place even in an association state when individual fine metal particle has a predetermined particle diameter, unless particles are completely bound.

However, in general, metals are likely to be oxidized except for noble metals, and fine particles having particle diameters of at most 100 nm, which have large surface areas, are remarkably influenced by the surface oxidation, and the surface of the fine metal particles are oxidized also when an electric conductor is to be formed, whereby an electrical conductivity is less likely to be obtained.

DISCLOSURE OF THE INVENTION

The present invention provides fine particles of copper, nickel or palladium (hereinafter referred to as the present metal) hydride, having an average particle diameter of at most 50 nm (hereinafter referred to as the present fine hydride particles).

The present invention further provides a process for producing the present fine hydride particles, which comprises a step of adding water to a water soluble compound of the present metal (hereinafter referred to as the present water soluble metal compound) to obtain an aqueous solution containing ions of the present metal (hereinafter referred to as the present metal ions); a step of adding an acid to the aqueous solution to adjust the pH to at most 3; a step of adding a $C_{4-100}$ organic compound (hereinafter referred to simply as the present protective agent) having at least one group selected from the group consisting of an amino group, and an amide group, a mercapto group (—SH), a sulfide group (—S—), a hydroxyl group, a carboxyl group, a carbonyl group and an etheric oxy group, and a water insoluble organic liquid to the aqueous solution having the pH adjusted to at most 3; and a step of then adding a reducing agent with stirring to reduce the present metal ions in the aqueous solution thereby to form the present fine hydride particles having an average particle diameter of at most 50 nm.

Further, the present invention also provides a dispersion having the above obtained present fine hydride particles dispersed in a water insoluble organic liquid in such a state that the surface of the fine particles is coated with the present protective agent, and a metallic material obtained by applying the dispersion to an object to be coated, followed by baking.

MODE OF CARRYING OUT THE INVENTION

The present fine hydride particles are present in such a state that atoms of the present metal and hydrogen atoms are bonded. Accordingly, the present fine hydride particles are less likely to be oxidized and are stable in the atmosphere as compared with fine particles of the present metal itself, and are excellent in storage stability and thereby preferred. The present fine hydride particles are particularly preferably fine particles of copper or nickel hydride, since a metallic material having a low electrical resistance will be obtained.

The present fine hydride particles have such characteristics that they decompose into the present metal and hydrogen at a temperature of from 60 to 100° C. Accordingly, when the present fine hydride particles are applied to an object to be coated, followed by baking, a metal oxide film will hardly be formed on the surface of the fine particles, as different from the case of fine particles of the present metal itself. Accordingly, due to the surface melting, the present fine metal particles are melted and bonded to quickly form a metallic material, such being preferred. The baking temperature is preferably from 150 to 600° C.

The present fine hydride particles have an average particle diameter of at most 50 nm, whereby formation of fine wiring will be possible. The smaller the particle diameter of the present fine hydride particles, the lower the surface melting temperature tends to be, whereby the surface melting is likely to occur, and the denser the metallic material to be formed will be, whereby the electrical conductivity is expected to improve. The present fine hydride particles particularly preferably have an average particle diameter of from 5 to 30 nm.

In the present invention, the average particle diameter of the present fine hydride particles is measured by means of a transmission electron microscope (TEM) or a scanning electron microscope (SEM). In the present invention, particle diameters of fine particles mean particle diameters of observed primary particles, and the average particle diameter is defined as an average diameter of randomly sampled 100 fine particles among observed fine particles.

The present fine hydride particles are produced preferably by a wet reduction process. The present water soluble metal compound as a raw material is dissolved in water to prepare an aqueous solution containing the present metal ions, an acid is added thereto to adjust the pH to at most 3, and then the present protective agent and a water insoluble organic liquid are added thereto, and then a reducing agent is added thereto with stirring to reduce the present metal ions thereby to form the present fine hydride particles.

When the present fine hydride particles are formed, by stirring an aqueous layer comprising the aqueous solution containing the present metal ions and an oil layer comprising the present protective agent and the water insoluble organic liquid, a suspension comprising moisture components and oil components will be formed. In the moisture components of the suspension, the present metal ions are reduced by means of the reducing agent in acidic conditions, the present fine hydride particles gradually grow to obtain fine particles having an average particle diameter of at most 50 nm. It is considered that the surface of the obtained present fine hydride particles is quickly covered with the present protective agent dissolved in the oil components and absorbed in the oil components and stabilized. The temperature for the reduction reaction is preferably from 5 to 60° C., particularly preferably from 10 to 40° C. If the reduction temperature is higher than 60° C., the obtained present fine hydride particles may decompose.

When the suspension is left to stand after the present fine hydride particles are formed, the suspension will be separated into two layers, an aqueous layer and an oil layer. The oil layer is recovered, whereby a dispersion having the present fine hydride particles dispersed in the water insoluble organic liquid will be obtained. The dispersion as it is or after having another additive suitably added thereto, can be used as an ink for formation of a metallic material (hereinafter referred to simply as an ink). The obtained dispersion or ink has the present fine hydride particles dissolved in a water insoluble organic liquid, whereby oxidation of a metal due to storage in the atmosphere, which has been problematic, can be prevented. Further, in the dispersion containing the present fine hydride particles, the surface of the present fine hydride particles is coated with the present protective agent, whereby the present fine hydride particles are less likely to agglomerate and are stably dispersed.

The present water soluble metal compound may, for example, be a sulfate compound, a nitrate, an acetate, a chloride, a bromide or an iodide of the present metal. The present water soluble metal compound is preferably in the form of an aqueous solution having a concentration of from 0.1 to 30 mass %. If the aqueous solution of the present water soluble metal compound has a concentration less than 0.1 mass %, a large quantity of water is required, and further, the production efficiency of the present fine hydride particles to be obtained tends to be poor, and if the aqueous solution has a concentration exceeding 30 mass %, agglomeration stability of the present fine hydride particles to be obtained tends to be low.

Further, the acid to adjust the pH is preferably citric acid, maleic acid, malonic acid, acetic acid, propionic acid, sulfuric acid, nitric acid, hydrochloric acid or the like, and it is particularly preferably citric acid, maleic acid or malonic acid, which forms a stable complex with the present metal ions thereby to prevent adsorption of water of hydration to the present metal ions. By adjusting the pH to at most 3, the present metal ions in the aqueous solution are likely to be obtained as the present fine hydride particles by the action of the reducing agent to be added later. If the pH exceeds 3, the present fine hydride particles will not be obtained, but fine particles of the present metal may be obtained. The pH is particularly preferably from 1 to 2, whereby the present fine hydride particles will be formed in a short time.

In the present invention, the reducing agent is added preferably in an amount of from 1.5 to 10 times by equivalent amount to the present metal ions. If the amount of the reducing agent added is less than 1.5 times by equivalent amount to the metal ions, the reducing effect will be insufficient, and if it exceeds 10 times by equivalent amount, the agglomeration stability of the present fine hydride particles to be obtained tends to decrease. The reducing agent is preferably a metal hydride, which has a high reducing effect, such as lithium aluminum hydride, lithium borohydride, sodium borohydride, lithium hydride, potassium hydride or calcium hydride. The metal hydride is particularly preferably lithium aluminum hydride, lithium borohydride or sodium borohydride.

Further, in the present invention, it is preferred to add the present protective agent to the aqueous solution containing the present metal ions before the reducing agent is added. By addition of the present protective agent, after the present fine hydride particles are obtained, the present protective agent covers the surface of the present fine hydride particles so as to coordinate to the fine particles. Accordingly, the present fine hydride particles in the dispersion or in the ink are less likely to be oxidized, and further, an effect of preventing the present fine hydride particles from agglomerating will be obtained.

The present protective agent has from 4 to 100 carbon atoms. If it has less than 4 carbon atoms, the agglomeration stability of the present fine hydride particles to be obtained in the dispersion may be insufficient. Further, if it has more than 100 carbon atoms, when a metallic material is to be obtained by baking, carbon is likely to remain in the ink deposit, thus increasing the volume resistivity. Further, the present protective agent may be either a saturated or an unsaturated compound, and it is preferably a chain compound, particularly preferably a straight chain compound. Further, the present protective agent preferably has from 4 to 20 carbon atoms, whereby it will be thermally stable, its vapor pressure will be appropriate, and favorable handling efficiency will be obtained. The present protective agent particularly preferably has from 8 to 18 carbon atoms.

Further, the present protective agent has in its molecule at least one group selected from the group consisting of an amino group, an amide group, a mercapto group (–SH), a sulfide group (—S—), a hydroxyl group, a carboxyl group, a carbonyl group and an etheric oxy group. The larger the number of such groups in the molecule, the more strongly the protective agent will coordinate to the present fine hydride particles thereby to cover their surface. Further, such a group is present at any position in the molecule, but it is present particularly preferably at the terminal.

Further, it is required that the present protective agent will not leave from the present fine hydride particles within a temperature range in usual storage, and that it quickly leaves from the surface of the fine metal particles at the time of baking. Accordingly, the present protective agent has a boiling point of preferably from 60 to 300° C., particularly preferably from 100 to 250° C.

As the present protective agent, an organic compound containing an amino group or an amide group may, for example, be octylamine, decylamine, dodecylamine, tetradecylamine, hexadecylamine, stearylamine, oleylamine, benzylamine, stearylamide or oleylamide. An organic compound containing a mercapto group or a sulfide group may, for example, be decanethiol, dodecanethiol, trimethylbenzyl mercaptan, butylbenzyl mercaptan or hexyl sulfide. An organic compound containing a hydroxyl group, a carboxyl group, a carbonyl group or an etheric oxy group may, for example, be dodecanediol, hexadecandiol, dodecanoic acid, stearic acid, oleic acid, linoleic acid, linolenic acid, dodecanedione, dibenzoylmethane, ethylene glycol monodecyl ether, diethylene glycol monodecyl ether, triethylene glycol monodecyl ether, tetraethylene glycol monodecyl ether, ethylene glycol monododecyl ether, diethylene glycol monododecyl ether, triethylene glycol monododecyl ether, tetraethylene glycol monododecyl ether, ethylene glycol monocetyl ether or diethylene glycol monocetyl ether. Among them, a compound having an amino group such as octylamine, decylamine, dodecylamine, tetradecylamine, hexadecylamine, stearylamine, oleylamine or benzylamine is particularly preferred since the present metal ions can be-efficiently recovered from the aqueous layer to the oil layer, and decylamine, dodecylamine, tetradecylamine or hexadecylamine is most preferred.

The present protective agent is added preferably in an amount of from 5 to 300 parts by mass per 100 parts by mass of the present fine hydride particles, although the addition amount is suitably selected depending upon the purpose of use of the ink.

In the present invention, the water insoluble organic liquid (hereinafter referred to simply as an organic liquid) is preferably one having low polarity and having good affinity to the present protective agent which covers the surface of the present fine hydride particles, so as to function as a solvent in the dispersion. Further, the organic liquid is preferably such that it relatively quickly evaporates by heating after application when a metallic material is to be formed, and that it has thermal stability so that it will not undergo pyrolysis. The organic liquid may, for example, be at least one member selected from the group consisting of hexane, heptane, octane, decane, dodecane, tetradecane, decene, dodecene, tetradecene, cyclohexane, cyclooctane, dipentene, terpene, terpineol, xylene, toluene, ethylbenzene and mesitylene. The organic liquid is added preferably in an amount of from 20 to 270 parts by mass per 100 parts by mass of the present fine hydride particles, although the addition amount is suitably selected depending upon the purpose of use of the ink.

In the present invention, in a case where the dispersion is used to prepare an ink, the concentration of the present fine hydride particles is preferably from 5 to 60 mass %, particularly preferably from 10 to 50 mass %, based on the ink, although it suitably varies depending upon the purpose of use of the ink. If the concentration of the present fine hydride particles is less than 5 mass %, no sufficient thickness of an ink deposit cured product is likely to be obtained after baking, and the electrical conductivity of a metallic material to be obtained tends to be low. Further, if the concentration exceeds 60 mass %, ink characteristics such as viscosity of the ink and surface tension tend to deteriorate, and use as an ink tends to be difficult. To the ink, an additive, an organic binder or the like may suitably be added depending upon the purpose of use.

In the present invention, as a method of applying the ink to form a metallic material, various known methods may be employed. The coating method may, for example, be a method by means of ink jet printing, screen printing, a roll coater, an air knife coater, a blade coater, a bar coater, a gravure coater, a die coater, a spray coater or a slide coater. Among them, a method by means of ink jet printing is particularly preferred. In a case of printing by means of an ink jet printer, it is preferred that the ink discharge nozzle is at a level of 20 μm, and the diameter of ink droplets varies during flying after discharge, and after the ink droplets arrive at an object to be coated, they spread thereon. The diameter of the ink droplets immediately after discharge is at a level of the size of the discharge nozzle, and after the ink droplets arrive at the object to be coated, the diameter of the ink attached to the object expands to a level of from 5 to 100 μm. Accordingly, the fine particles in the ink may be agglomerated so long as the ink viscosity and the like are not affected, and in such a case, the agglomerate diameter is preferably at most 2 μm.

In the present invention, as a baking method to obtain a metallic material after application of the ink may, for example, be hot air drying or thermal radiation. The heating temperature and the treatment time are suitably determined depending upon important characteristics practically required.

The metallic material of the present invention preferably has a volume resistivity of at most 100 μΩcm after baking. If it has a volume resistivity exceeding 100 μΩcm, its use as an electrically conductive electrode of an electronic component may be difficult in some cases.

EXAMPLES

Now, Examples of the present invention (Examples 1 to 6, 10 and 11) and Comparative Examples (Examples 7 to 9 and 12) will be shown below. The average particle diameter of the present fine hydride particles obtained in Examples was measured by means of a transmission electron microscope (manufactured by Hitachi, Ltd., model: H-9000) or a scanning electron microscope (manufactured by Hitachi, Ltd., model: S-900). X-ray diffraction was measured by means of RINT2500 manufactured by Rigaku Corporation.

Example 1

In a glass container, 5 g of copper(II) chloride dihydrate was dissolved in 150 g of distilled water to obtain an aqueous solution containing copper ions. The obtained aqueous solution had a pH of 3.4. 90 g of a 40% citric acid aqueous solution (% represents mass %) was added thereto, followed by stirring for a while, whereupon the obtained aqueous solution had a pH of 1.7. To this aqueous solution, a mixed solution comprising 5 g of dodecylamine and 10 g of cyclohexane was added, and 150 g of a 3% sodium borohydride aqueous solution was slowly dropwise added with vigorous stirring. After completion of the dropwise addition, the solution was left at rest for one hour to be separated into an aqueous layer and an oil layer, and then the oil layer alone was recovered to obtain a black ink having fine particles dispersed therein. After the ink was left to stand for one day, the ink remained black. The fine particles in the ink were recovered and identified by X-ray diffraction and as a result, they were confirmed to be copper hydride. Further, the ink was dried to obtain a particulate powder, and the sizes of the fine particles were measured and as a result, the average particle diameter was confirmed to be about 10 nm. The concentration of the fine copper hydride particles in the ink was 20%. This ink after having been left to stand for one day was discharged from an ink jet printer and dried, and then the ink deposit thus formed was subjected to a heat treatment in a nitrogen atmosphere at 500° C. for one hour, whereupon a film with a thickness of 4 μm was formed. The volume resistivity of the film was measured and as a result, it was 15 μΩcm. Further, this film was identified by X-ray diffraction and as a result, it was confirmed to be made of metal copper. Hereinafter identification of a metal was by means of X-ray diffraction.

Example 2

The same operation as in Example 1 was carried out except that dodecanethiol was used instead of dodecylamine and that toluene was used instead of cyclohexane, to obtain a black ink having fine particles dispersed therein. Measurement was carried out in the same manner as in Example 1 and as a result, it was confirmed that the fine particles in the obtained ink were copper hydride, and the average particle diameter was about 10 nm. Further, a film was formed in the same manner as in Example 1, whereupon the film had a volume resistivity of 18 μΩcm and confirmed to be made of metal copper.

Example 3

The same operation as in Example 1 was carried out except that a commercial 3% polymer dispersing agent having an amino group, an amide group and an etheric oxy group (manufactured by BYK-Chemie, tradname: Anti-Terra-U, carbon number: from about 60 to about 70) was used instead of dodecylamine, and that tetradecane was used instead of cyclohexane, to obtain a black ink having fine particles dispersed therein. Measurement was carried out in the same manner as in Example 1 and as a result, it was confirmed that the fine particles in the obtained ink were copper hydride, and the average particle diameter was about 10 nm. Further, a film was formed in the same manner as in Example 1, whereupon the film had a volume resistivity of 20 μΩcm and confirmed to be made of metal copper.

Example 4

The same operation as in Example 1 was carried out except that 54 g of a 40% maleic acid aqueous solution was used instead of the citric acid aqueous solution, to obtain a black ink having fine particles dispersed therein. Measurement was carried out in the same manner as in Example 1 and as a result, it was confirmed that the fine particles in the obtained ink were copper hydride, and the average particle diameter was about 12 nm. The concentration of the fine copper hydride particles in the ink was 14%. Further, a film was formed in the same manner as in Example 1, whereupon the film had a volume resistivity of 15 μΩcm and confirmed to be made of metal copper.

Example 5

The same operation as in Example 1 was carried out except that 47 g of a 40% malonic acid aqueous solution was used instead of the citric acid aqueous solution, to obtain a black ink having fine particles dispersed therein. Measurement was carried out in the same manner as in Example 1 and as a result, it was confirmed that the fine particles in the obtained ink were copper hydride, and the average particle diameter was about 11 nm. The concentration of the fine copper hydride particles in the ink was 11%. Further, a film was formed in the same manner as in Example 1, whereupon the film had a volume resistivity of 15 μΩcm and confirmed to be made of metal copper.

Example 6

The same operation as in Example 1 was carried out except that 21 g of a 35% hydrochloric acid aqueous solution was used instead of the citric acid aqueous solution, to obtain a black ink having fine particles dispersed therein. Measurement was carried out in the same manner as in Example 1 and as a result, it was confirmed that the fine particles in the obtained ink were copper hydride, and the average particle diameter was about 11 nm. The concentration of the fine copper hydride particles in the ink was 14%. Further, a film was formed in the same manner as in Example 1, whereupon the film had a volume resistivity of 15 μΩcm and confirmed to be made of metal copper.

Example 7

The same operation as in Example 1 was carried out except that no citric acid aqueous solution was added, to obtain a black ink having fine particles dispersed therein. After the obtained ink was left to stand for one day, the ink colored yellow. Measurement was carried out in the same manner as in Example 1 and as a result, it was confirmed that the fine particles in the obtained ink were cuprous oxide ($Cu_2O$), and the average particle diameter was about 10 nm. Further, a film was formed in the same manner as in Example 1, whereupon the volume resistivity of the film could not be measured since the film did not conduct electricity. Further, this film was identified by an X-ray diffraction apparatus and as a result, it was confirmed to be made of cuprous oxide ($Cu_2O$).

Example 8

The same operation as in Example 2 was carried out except that no citric acid aqueous solution was added, to obtain a black ink having fine particles dispersed therein. After the obtained ink was left to stand for one day, the ink colored yellow. Measurement was carried out in the same manner as in Example 1 and as a result, it was confirmed that the fine particles in the obtained ink were cuprous oxide ($Cu_2O$), and the average particle diameter was about 10 nm. Further, a film was formed in the same manner as in Example 1, whereupon the volume resistivity of the film could not be measured since the film did not conduct electricity. Further, this film was identified by an X-ray diffraction apparatus and as a result, it was confirmed to be made of cuprous oxide ($Cu_2O$).

Example 9

The same operation as in Example 3 was carried out except that no citric acid aqueous solution was added, to obtain a black ink having fine particles dispersed therein. After the obtained ink was left to stand for one day, the ink colored yellow. Measurement was carried out in the same manner as in Example 1 and as a result, it was confirmed that the fine particles in the obtained ink were cuprous oxide ($Cu_2O$), and the average particle diameter was about 10 nm. Further, a film was formed in the same manner as in Example 1, whereupon the volume resistivity of the film could not be measured since the film did not conduct electricity. Further, this film was identified by an X-ray diffraction apparatus and as a result, it was confirmed to be made of cuprous oxide ($Cu_2O$).

Example 10

An aqueous solution containing copper ions was prepared in the same manner as in Example 1 except that the amount of the 40% citric acid aqueous solution used was changed to 75 g, whereupon the obtained aqueous solution had a pH of 2.6. Further, the same operation as in Example 1 was carried out except that after completion of the dropwise addition of the sodium borohydride aqueous solution, the solution was left at rest for 3 hours to be separated into an aqueous layer and an oil layer, whereupon a black ink having fine particles dispersed therein was obtained. Measurement was carried out in the same manner as in Example 1 and as a result, it was confirmed that the fine particles in the obtained ink were copper hydride, and the average particle diameter was about 10 nm. Further, a film was formed in the same manner as in Example 1, whereupon the film had a volume resistivity of 15 μΩcm and confirmed to be made of metal copper.

Example 11

In a glass container, 5 g of nickel(II) chloride hexahydrate was dissolved in 150 g of distilled water to obtain an aqueous solution containing nickel ions. The obtained aqueous solution had a pH of 3.6. To this aqueous solution, 90 g of a 40% citric acid aqueous solution was added, followed by stirring for a while, whereupon the obtained aqueous solution had a pH of 1.9. To this aqueous solution, a mixed solution comprising 5 g of the same polymer dispersing agent as in Example 3 and 10 g of dipentene was added, and 150 g of a 3% sodium borohydride aqueous solution was slowly dropwise added with vigorous stirring. After completion of the dropwise addition, the solution was left at rest for one hour to be separated into an aqueous layer and an oil layer, and the oil layer alone was recovered to obtain a black ink having fine particles dispersed therein. After the ink was left to stand for one day, the ink remained black. The fine particles in the ink were recovered and identified by X-ray diffraction and as a result, formation of nickel hydride and a small amount of nickel oxide (NiO) was confirmed. Further, the ink was dried to obtain a particulate powder, and the sizes of the fine particles were measured and as a result, the average particle diameter was confirmed to be about 15 nm. The concentration of the fine nickel hydride particles and the small amount of the fine nickel oxide particles in the ink was 12%. The ink after having been left to stand for one day was discharged from an ink jet printer and dried, and the ink deposit thus formed was subjected to a heat treatment in a nitrogen atmosphere at 500° C. for 1 hour and as a result, a film with a thickness of 2.5 μm was formed. The volume resistivity of this film was measured and as a result, it was 80 μΩcm. Further, this film was identified by means of X-ray diffraction and as a result, it was confirmed to be made of metal nickel and a small amount of nickel oxide (NiO).

Example 12

The same operation as in Example 11 was carried out is except that no citric acid aqueous solution was added, to obtain a black ink having fine particles dispersed therein. After the obtained ink was left to stand for one day, the ink colored blackish brown. Measurement was carried out in the same manner as in Example 1 and as a result, it was confirmed that the fine particles in the obtained ink were nickel oxide (NiO), and the average particle diameter was about 10 nm.

Further, a film was formed in the same manner as in Example 11, whereupon the volume resistivity of the film could-not be measured since the film did not conduct electricity. Further, this film was identified by an X-ray diffraction apparatus and as a result, it was found to be made of nickel oxide (NiO).

INDUSTRIAL APPLICABILITY

The present fine hydride particles and a dispersion s thereof to be obtained by the present invention are applicable to various applications, and they can be used for e.g. formation and repair of printed wiring, etc. employing a dispersion, interlayer wiring in semiconductor packages, and joining of printed wiring boards and electronic components.

The entire disclosure of Japanese Patent Application No. 2003-164666 filed on Jun. 10, 2003 including specification, claims and summary is incorporated herein by reference in its entirety.

What is claimed is:

1. A dispersion comprising fine particles of copper hydride dispersed in a water insoluble organic liquid; wherein the copper hydride fine particles are obtained by adding a reducing agent to an aqueous solution of cooper ion comprising $C_{4-100}$ organic straight chain compound having at least one group selected from the group consisting of an amino group, an amide group, a mercapto group (—SH), a sulfide group (—S—), a hydroxyl group, a carboxyl group, a carbonyl group and an etheric oxy group, wherein the pH of the aqueous solution is 3 or less, the dispersion comprising fine particles of copper hydride dispersed in a water insoluble organic liquid is a storage stable ink for the application of an electrically conductive copper layer;

an average particle diameter of the fine particles of copper hydride is at most 50 nm, and the surface of the copper hydride fine particles is coated with a $C_{4-100}$ organic straight chain compound having at least one group selected from the group consisting of an amino group, an amide group, a mercapto group (—SH), a sulfide group (—S—), a hydroxyl group, a carboxyl group, a carbonyl group and an etheric oxy group.

2. The dispersion as claimed in claim 1, wherein the fine particles of copper hydride have an average particle diameter of about 10-15 nm.

3. The dispersion as claimed in claim 1, wherein said water insoluble organic liquid is at least one member selected from the group consisting of hexane, heptane, octane, decane, dodecane, tetradecane, decene, dodecene, tetradecene, cyclohexane, cyclooctane, dipentene, terpene, terpineol, xylene, toluene, ethylbenzene and mesitylene.

4. The dispersion as claimed in claim 1, wherein said water insoluble organic liquid is present in an amount of from 20 to 270 parts by mass per 100 parts by mass of the copper hydride fine particles.

5. The dispersion as claimed in claim 2, wherein said water insoluble organic liquid is at least one member selected from the group consisting of hexane, heptane, octane, decane, dodecane, tetradecane, decene, dodecene, tetradecene, cyclohexane, cyclooctane, dipentene, terpene, terpineol, xylene, toluene, ethylbenzene and mesitylene.

6. The dispersion as claimed in claim 2, wherein said water insoluble organic liquid is present in an amount of from 20 to 270 parts by mass per 100 parts by mass of the hydride particles.

7. The dispersion as claimed in claim 2, wherein said water insoluble organic liquid is at least one member selected from the group consisting of hexane, heptane, octane, decane, dodecane, tetradecane, decene, dodecene, tetradecene, cyclohexane, cyclooctane, dipentene, terpene, terpineol, xylene, toluene, ethylbenzene and mesitylene and wherein said water insoluble organic liquid is present in an amount of from 20 to 270 parts by mass per 100 parts by mass of the copper hydride fine particles.

8. The dispersion as claimed in claim 1, wherein said $C_{4-100}$ organic compound having at least one group selected from the group consisting of an amino group, an amide group, a mercapto group (—SH), a sulfide group (—S—), a hydroxyl group, a carboxyl group, a carbonyl group and an etheric oxy group is at least one selected from the group consisting of octylamine, decylamine, dodecylamine, tetradecylamine, hexadecylamine, stearylamine, oleylamine, benzylamine, stearylamide or oleylamide, decanethiol, dodecanethiol, trimethylbenzyl mercaptan, butylbenzyl mercaptan, hexyl sulfide, dodecanediol, hexadecandiol, dodecanoic acid, stearic acid, oleic acid, linoleic acid, linolenic acid, dodecanedione, dibenzoylmethane, ethylene glycol monodecyl ether, diethylene glycol monodecyl ether, triethylene glycol monodecyl ether, tetraethylene glycol monodecyl ether, ethylene glycol monododecyl ether, diethylene glycol monododecyl ether, triethylene glycol monododecyl ether, tetraethylene glycol monododecyl ether, ethylene glycol monocetyl ether and diethylene glycol monocetyl ether.

9. The dispersion as claimed in claim 1, wherein said $C_{4-100}$ organic compound having at least one group selected from the group consisting of an amino group, an amide group, a mercapto group (—SH), a sulfide group (—S—), a hydroxyl group, a carboxyl group, a carbonyl group and an etheric oxy group is at least one selected from the group consisting of decylamine, dodecylamine, tetradecylamine and hexadecylamine.

10. The dispersion as claimed in claim 1, wherein said $C_{4-100}$ organic compound having at least one group selected from the group consisting of an amino group, an amide group, a mercapto group (—SH), a sulfide group (—S—), a hydroxyl group, a carboxyl group, a carbonyl group and an etheric oxy group is present in an amount of from 5 to 300 parts by mass per 100 parts by mass of the copper hydride fine particles.

* * * * *